(12) United States Patent
Fazelpour

(10) Patent No.: US 6,608,363 B1
(45) Date of Patent: Aug. 19, 2003

(54) TRANSFORMER COMPRISING STACKED INDUCTORS

(75) Inventor: Siamak Fazelpour, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 64 days.

(21) Appl. No.: 09/797,307

(22) Filed: Mar. 1, 2001

(51) Int. Cl.⁷ .................. H01L 29/00; H01L 21/20
(52) U.S. Cl. .................. 257/531; 257/528; 257/728; 438/381
(58) Field of Search .................. 438/381; 257/531, 257/528, 532, 728, 700

(56) References Cited

U.S. PATENT DOCUMENTS

| | | | | |
|---|---|---|---|---|
| 5,834,825 A | * | 11/1998 | Imai | 257/531 |
| 5,877,667 A | * | 3/1999 | Wollesen | 336/200 |
| 6,054,329 A | * | 4/2000 | Burghartz | 438/238 |
| 6,114,932 A | * | 9/2000 | Wester et al. | 336/200 |
| 6,147,857 A | * | 11/2000 | Worley et al. | 361/328 |
| 6,399,997 B1 | * | 6/2002 | Lin et al. | 257/531 |

* cited by examiner

Primary Examiner—Michael Trinh
(74) Attorney, Agent, or Firm—Farjami & Farjami LLP

(57) ABSTRACT

A transformer fabricated over a semiconductor die has been disclosed. A disclosed embodiment comprises a first inductor fabricated over a first bond pad. The first inductor is electrically connected to the first bond pad. For example, the bond pad can comprise copper, aluminum, copper-aluminum alloy, or gold. The disclosed embodiment further comprises a dielectric deposited over the first inductor. The disclosed embodiment further comprises a second inductor fabricated over the dielectric. For example, the dielectric can comprise BCB or low-k polyimide. Also, by way of example, the first and the second inductor can comprise copper, aluminum, copper-aluminum alloy, or gold.

20 Claims, 2 Drawing Sheets

TRANSFORMER COMPRISING STACKED INDUCTORS

BACKGROUND OF THE INVENTION

1. Field of the Invention

The present invention is generally in the field of fabrication of electronic circuit components. In particular, the present invention is in the field of fabrication of inductors used to build transformers used in electronic circuits.

2. Background Art

It is known in the art that there is an ever-present demand for decreasing electronic circuit component sizes and geometries. The demand is fueled, in large part, by the consumer' desire for ever-smaller portable communication and information processing devices, such as cellular telephones, hand-held wireless information assistants, laptop computers, and networking devices. The requirement to decrease the size of these consumer communication and information processing devices has resulted, among other things, in a general trend in the market to integrate everything on a chip—to have systems on a chip. In addition to the size reduction obtained with a system on a chip, there is also a manufacturing cost reduction. These systems on a chip have resulted in Ultra Large Scale Integration (ULSI) chips containing over a million components per chip. However, the transformer, an off-chip electronic component, has not benefited from this dramatic decrease in size. Attempts in the art to realize an on-chip transformer encounter various problems, such as size, unwanted capacitance, low quality factor, low self-resonance frequency, and low coefficient of coupling of the transformer's cross-coupled inductors. These problems become more severe as the operating frequency of the transformer increases. For example, these problems greatly hinder the design of transformers for use in RF applications in the commercially important wireless communication range of 800 to 2400 MHz.

The problems mentioned above that are encountered in the art in an attempt to realize an on-chip transformer will be illustrated by reference to an exemplary transformer shown in top view 100 in FIG. 1A and in cross-sectional view 122 in FIG. 1B.

FIG. 1A shows a top view 100 of an exemplary transformer on an area of a semiconductor die. A first inductor is also referred to as primary winding 104 in FIGS. 1A and 1B. A second inductor is also referred to as secondary winding 106 in FIGS. 1A and 1B. For illustration purposes, primary winding 104 and secondary winding 106 of the exemplary transformer shown in FIGS. 1A and 1B are patterned in a manner known in the art in metal level one. However primary winding 104 and secondary winding 106 can be implemented at any metal level in the semiconductor die. The distance between adjacent segments of primary winding 104 and secondary winding 106 is referred to by numeral 108 in FIG. 1A. The diameter of primary winding 104 is referred to by numeral 118 in FIG. 1A.

FIG. 1B shows cross-sectional view 122 of the exemplary transformer along the line B—B in FIG. 1A. The width of a segment of primary winding 104 is referred to by numeral 114 while the width of a segment of secondary winding 106 is referred to by numeral 124. Thickness 110 refers to the thickness of primary winding 104 and secondary winding 106. Dielectric 120 having thickness 112 is situated between the lower surface of primary winding 104 (or the lower surface of second winding 106) and silicon substrate 116.

By way of background, a transformer is comprised essentially of two cross-coupled inductors. The magnetic coupling between the two inductors is called mutual inductance. The quality factor ("Q") of an inductor is determined by the formula $Q=2\pi fL/R$, where L is the inductance of the inductor, f is the operating frequency of the inductor, and R is the resistance of the inductor. A relatively low quality factor signifies a relatively high energy loss. Therefore, by increasing the respective quality factors of a transformer's cross-coupled inductors, the energy loss in the transformer can be decreased. Consequently, increasing the inductance of the transformer's inductors will decrease the energy loss in a transformer. Also, decreasing the resistance of the transformer's inductors can also decrease the energy loss in a transformer.

Each of the primary or secondary windings in the exemplary transformer shown in FIGS. 1A and 1B is analogous to a "square spiral inductor" known in the art. The problems encountered when attempting to increase the inductance of the primary winding or secondary winding of the exemplary transformer shown in FIGS. 1A and 1B are thus analogous to the is problems encountered in increasing the inductance of a square spiral inductor. For example, typical inductor values for a square spiral inductor used in mixed signal circuits and in RF applications range from 1 to 100 nanohenrys. To achieve a square spiral inductor having a value of 30 nano-henrys using a fabrication process with a metal pitch of 5.0 microns, the inductor would require approximately 17 "metal turns" and would have a "diameter" of approximately 217 microns. As such, even a 30 nano-henry conventional on-chip inductor would require a considerable amount of die space.

Moreover, for a given diameter 118, the inductance is proportional to $n^2$, where n is the number of "metal turns" of primary winding 104. Therefore, increasing the number of "metal turns" of primary winding 104 can increase the inductance of primary winding 104. However, as the number of "metal turns" increases, the overall resistance of primary winding 104 will also increase. As stated above, the quality factor of an inductor is inversely proportional to the inductor's resistance. Thus, the increase in the overall resistance of the inductor, for example primary winding 104, will decrease the quality factor of the inductor. As also explained above, a decrease in the quality factor of an inductor results in a greater energy loss in the inductor. Therefore, if primary winding 104 were cross-coupled to another similar on-chip inductor, for example to secondary winding 106, the resulting transformer would suffer a corresponding energy loss.

It is known in the art that the self-resonance frequency of an inductor is inversely related to the capacitance of the inductor. It is also known in the art that the self-resonance frequency of an inductor should be greater than twice the operating frequency of the inductor for optimal operation. As such, optimal functioning of the inductor requires that the inductor have a low inherent capacitance value. Moreover, the need to reduce the inductor's capacitance increases as the operating frequency of the inductor increases. As such, the inductor's capacitance becomes a limiting factor in the use of on-chip inductors and consequently on-chip transformers, at relatively high frequencies, such as 800 to 2400 MHz.

It is known in the art that the capacitance of an inductor that is patterned into a metal level of a semiconductor die is proportional to (l*w)/d, where "l" is the total length of all the segments of the inductor, "w" is the width of a segment of the inductor, and "d" is the distance between the metal level the inductor is patterned in and the silicon substrate or the next lower metal level of the chip.

In our exemplary transformer shown in FIGS. 1A and 1B, the capacitance of primary winding 104 can be decreased by either decreasing width 114 of primary winding 104 or increasing the distance between the metal level the inductor is patterned in and the silicon substrate. However, by decreasing width 114 of primary winding 104 in an attempt to decrease the capacitance of primary winding 104, the resistance of primary winding 104 is increased. Since the quality factor of an inductor, such as primary winding 104, is inversely proportional to its resistance, increasing the resistance of primary winding 104 decreases its quality factor. Therefore, decreasing width 114 of primary winding 104 is not an effective method of reducing the capacitance of primary winding 104.

Another problem that significantly affects the design of the exemplary transformer shown in FIGS. 1A and 1B is a very low coupling coefficient between the primary and secondary windings of the transformer. By way of background, in a transformer with two cross-coupled inductors, i.e. two windings, the coupling coefficient of the transformer is related to the percentage of the magnetic field created by one of the windings that flows through, i.e. that is coupled to, the other winding. Therefore, a coupling coefficient of "1.0" means that all of the magnetic field generated by the primary winding flows through, or is coupled to, the secondary winding. It is known in the art that a maximum coefficient of coupling of only about 60% is possible for on-chip transformers with both the primary and secondary windings patterned in the same metal level of the chip. The reason is that a significant portion of the magnetic field generated by each of the windings does not intersect the area occupied by the opposite winding.

Instead of the on-chip transformer discussed above, another type of transformer that could potentially be used is a discrete off-chip transformer. However, a discrete off chip transformer also suffers from various disadvantages. The off-chip transformer requires relatively long off-chip wires and interconnect lines to connect the transformer terminals to on-chip devices. The relatively long off-chip wires and interconnect lines result in added and unwanted resistance, capacitance, and inductance. Energy would be lost due to this unwanted resistance, capacitance, and inductance. Additionally, the interconnects for off-chip transformers are subject to long-term damage from vibration, corrosion, chemical contamination, oxidation, and other chemical and physical forces. Exposure to vibration, corrosion, chemical contamination, oxidation, and other chemical and physical forces results in lower long-term reliability for off-chip transformers.

The off-chip transformer also requires assembly of at least two components, i.e. the chip itself and the off-chip transformer. The required assembly of two or more components introduces corresponding reliability issues and also results in a greater manufacturing cost.

Thus, there is a need in the art for a transformer that has a small size, very low capacitance, high quality factor and high self-resonance frequency, a high coupling coefficient, and which is reliable, cost-effective, and which does not require connections through off-chip wires or interconnect lines.

SUMMARY OF THE INVENTION

The present invention is directed to improved transformer comprising stacked inductors. The present invention discloses a transformer that is cost effective to fabricate, since the fabrication can easily fit into process well known in the art, such as bumping technology and flip-chip technology. The present invention does not require independent fabrication or assembly, as required by off-chip transformers.

In one embodiment, the present invention comprises a first inductor fabricated over a first bond pad. For example, the first inductor can comprise copper, aluminum, aluminum-copper alloy, or gold. Also, by way of example, the first bond pad can comprise copper, aluminum, aluminum-copper alloy, or gold. The invention's first inductor is electrically connected to the first bond pad. The invention further comprises a dielectric deposited over the first inductor. For example, the dielectric can comprise BCB or a low-k polyimide. The invention further comprises a second inductor fabricated over the dielectric. For example, the second inductor can comprise copper, aluminum, aluminum-copper alloy, or gold. In one embodiment, the invention can include a package encapsulating the first inductor, the dielectric, and the second inductor.

As described in the detailed description herein, the transformer of the present invention is fabricated over a semiconductor die, with very low unwanted capacitance, resulting in a high quality factor, high self-resonance frequency, and high coupling coefficient of the transformer's cross-coupled inductors.

DETAILED DESCRIPTION OF THE INVENTION

The present invention is directed to improved transformer comprising stacked inductors. The following description contains specific information pertaining to different types of materials, layouts, dimensions, and implementations of the invention's transformer. One skilled in the art will recognize that the present invention may be practiced with material, layout, or dimensions, different from those specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 2A:
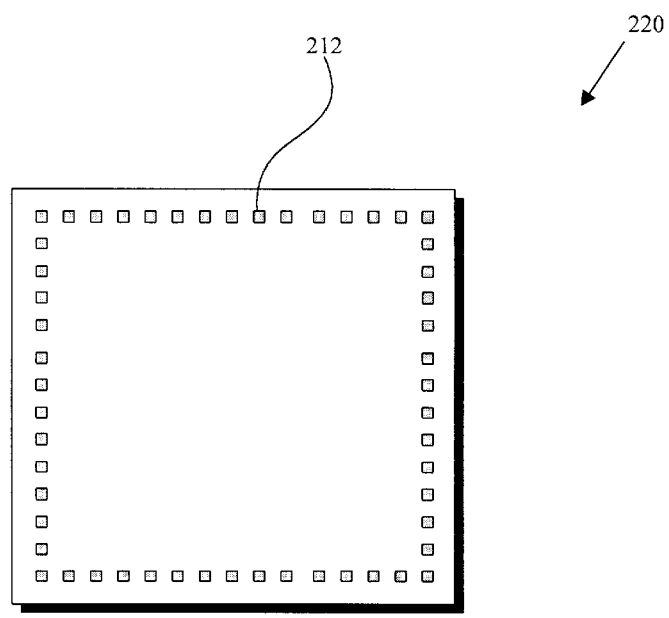
FIG. 2A illustrates a top view of a semiconductor die.
Figure 2B:
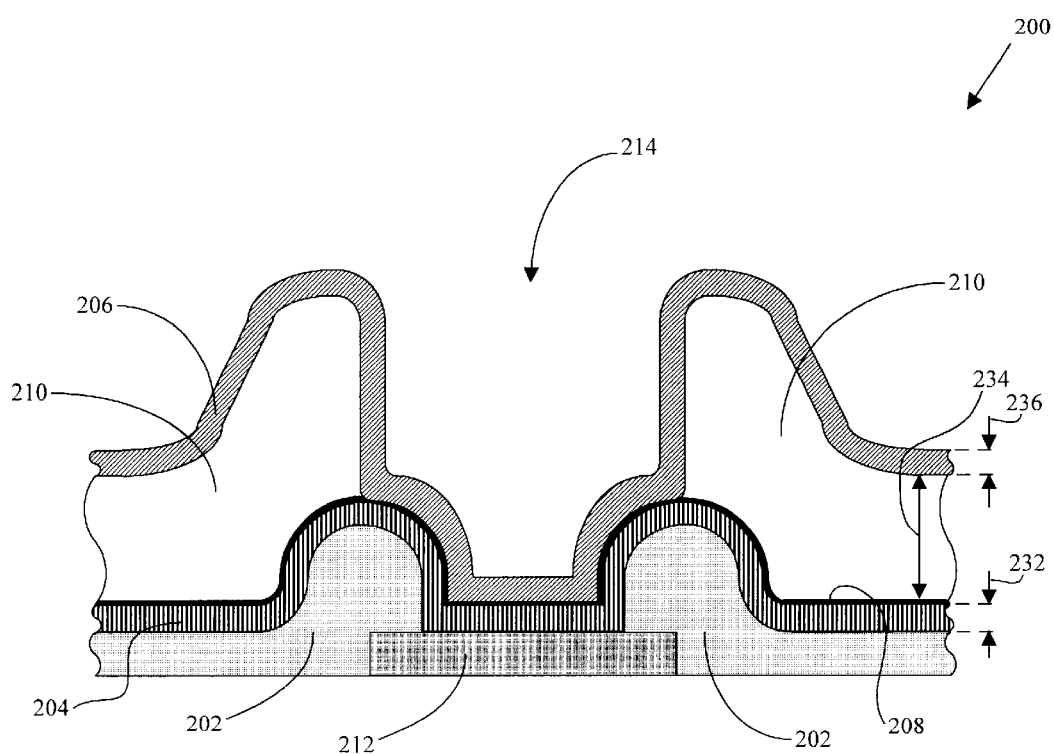
FIG. 2B illustrates a cross-sectional view of an exemplary embodiment of the invention's transformer at the location of a bond pad.

FIG. 2A shows a top view of a semiconductor die 220, which is used for illustration purposes only. FIG. 2A shows a number of metallic bond pads, such as bond pad 212 fabricated in semiconductor die 220. FIG. 2B shows a cross-sectional view of an exemplary embodiment of the invention's transformer 200 at the location of a bond pad, such as bond pad 212. Bond pad 212 in FIG. 2B corresponds to bond pad 212 in FIG. 2A. It is noted that the cross-sectional view of invention's transformer 200 is used for illustration purposes only. In other words, FIG. 2B does not depict the relative sizes of the various elements, does not show the relative thickness and depth of the various elements and is not to scale. Also, FIG. 2B shows only a small section of an embodiment of the invention's transformer 200.

It will be shown that the exemplary embodiment of the present invention's transformer 200 has small size, low capacitance, high quality factor and high self-resonance frequency of the invention's cross-coupled inductors. It will be further shown that the present invention's transformer 200 had a high coupling coefficient of the transformer's cross-coupled inductors, is reliable, cost-effective, and does not require connections through off-chip wires or interconnect lines.

The exemplary embodiment of the present invention's transformer 200 is formed above the last metal level of semiconductor die 220. Bond pad 212, in FIGS. 2A and 2B, can be aluminum. However, bond pad 212 may comprise other metals, such as copper, copper-aluminum alloy, or gold. By methods known to a person of ordinary skill in the art, passivation layer 202 in FIG. 2B is applied to the last metal level of semiconductor die 220, except that passivation layer 202 is not applied to areas where there is bond pad opening. As such, passivation layer 202 does not exist over bond pad 212. The thickness of passivation layer 202 can vary and, as an example, it can be 1.3 microns. Passivation layer 202 can be silicon dioxide; however, other passivation materials may also be used.

Inductor 204, also called a first inductor, is deposited and patterned on passivation layer 202 in a manner known in the art. For example, electroplating can be used to deposit a blanket metal layer over passivation layer 202. Inductor 204 can then be patterned on dielectric layer 202 by appropriately etching the deposited blanket metal layer. Electroplating allows thickness 232 of inductor 204 to be adjusted as needed.

Thickness 232 of inductor 204 can be, for example, approximately 3.0 to 5.0 microns. Inductor 204 can be copper. However, inductor 204 may comprise other metals such as aluminum, copper-aluminum alloy, or gold. Other methods known in the art can be used to deposit inductor 204, such as the evaporative method known in bumping technology. Passivation layer 208 is applied to inductor 204 to protect and insulate it from inductor 206. Passivation layer 208 can be silicon dioxide; however, other materials, such as silicon nitride, may be used. Next, dielectric layer 210 is deposited over passivation layer 208. Dielectric layer 210 can be a low-k dielectric, such as BCB or a low-k polyimide. BCB is an organic dielectric with a dielectric constant of approximately 2.5 to 4.0, and a low-k polyimide may have a dielectric constant of approximately 3.0 to 4.0. Thickness 234 of dielectric layer 210 can be, for example, 5.0 to 15.0 microns; however, thickness 234 can vary without departing from the scope of the present invention. Dielectric layer 210 can be deposited by methods well established in the art, such as by a spin on process. A spin on process is typically used to deposit a liquid dielectric, such as polyimide. In the spin on process, a puddle of a liquid dielectric, such as polyimide, is deposited in the center of a die that is spinning on a vacuum chuck.

As a result of the die spinning at a predetermined speed and a subsequent drying process, a uniform layer of polyimide is produced on the die.

Next, opening 214 in FIG. 2B is formed in dielectric layer 210. Inductor 206 is then deposited on dielectric layer 210. Inductor 206, also called a second inductor, is deposited and patterned on dielectric layer 210 in a manner known in the art. For example, electroplating can be used to deposit a blanket metal layer over dielectric layer 210. Inductor 206 can then be patterned on dielectric layer 210 by appropriately etching the deposited blanket metal layer. Electroplating allows thickness 236 of inductor 206 to be adjusted as needed. Thickness 236 of inductor 206 can be, for example, approximately 3.0 to 5.0 microns. Inductor 206 can be copper. However, inductor 206 may comprise other metals such as aluminum, copper-aluminum alloy, or gold. Other methods known in the art can be used to deposit inductor 206, such as the evaporative method known in bumping technology. Thus the exemplary embodiment of the present invention's transformer 200 is fabricated as a result of the above steps. However, the above steps used to fabricate the present embodiment of the invention's transformer 200 do not limit the scope of the invention. Other steps known in the art may be also be used to fabricate the invention's transformer 200.

As shown in the cross-sectional view of the exemplary embodiment of the invention's transformer 200 in FIG. 2B, inductor 206 is situated above inductor 204. A magnetic field generated by a current flowing through inductor 204 will flow through inductor 206. Likewise, a magnetic field generated by a current flowing through inductor 206 will flow through inductor 204. As is known in the art, when a magnetic field generated by a first inductor passes through a second inductor, and a magnetic filed generated by the second inductor passes through the first inductor, the inductors are said to be cross-coupled. Thus, inductor 204 and inductor 206 are cross-coupled. As such, the exemplary embodiment of the invention's transformer 200 comprises cross-coupled inductors 204 and 206.

The exemplary embodiment of the invention's transformer 200 in FIG. 2B makes electrical connection with semiconductor die 220 through bond pads, such as bond pad 212 in FIGS. 2A and 2B. In FIG. 2B, the cross-sectional view of the exemplary embodiment of the invention's transformer 200, a first terminal of inductor 204 is connected to bond pad 212. A second terminal of inductor 204 is connected to a second bond pad on semiconductor die 220, similar to bond pad 212. A first terminal of inductor 206 is connected to a third bond pad on semiconductor die 220 by, for example, a via that is formed in an opening in inductor 204. The via that connects one terminal of inductor 206 to the third bond pad on semiconductor die 220 can be insulated from inductor 204 by an appropriate passivation layer. In a similar manner, a second terminal of inductor 206 is connected to a fourth bond pad on semiconductor die 220 by, for example, a via that is formed in an opening in inductor 204. The via that connects the second terminal of inductor 206 to the fourth bond pad on semiconductor die 220 is also insulated from inductor 204 by an appropriate passivation layer. Thus, cross-coupled inductors 204 and 206 of an exemplary embodiment of the invention's transformer 200 are electrically connected to semiconductor die 220 by four bonding pads similar to bonding pad 212 in FIGS. 2A and 2B.

It is known in the art that the capacitance of an inductor formed on a semiconductor die is proportional to $(l*w)/d$, where "l" is the length of the inductor, "w" is the width of the inductor, and "d" is the distance from the patterned inductor to the silicon substrate or a lower metal level. For example, for an inductor such as inductor 206 in FIG. 2B, distance "d" corresponds to the distance between inductor 206 and a lower metal level, e.g. the metal level corresponding to inductor 204. The distance between inductor 206 and inductor 204 is equal to the thickness of dielectric layer 210 plus the thickness of passivation layer 208. Thus, distance "d" is determined by the thickness of dielectric layer 210 plus the thickness of passivation layer 208. The thickness of dielectric layer 210 can be approximately 5.0 to 15.0 microns. The thickness of passivation layer 208 can be, for example, 1.3 microns. Therefore, for an inductor such as inductor 206 of the invention's transformer 200, distance "d" can vary from approximately 6.3 to 16.3 microns. As stated above, in the exemplary transformer in FIGS. 1A and 1B, distance "d", for an inductor such as primary winding 104 and secondary winding 106, is equal to the thickness of dielectric layer 120, typically 1000 to 6000 Angstroms. Therefore, distance "d" is much greater for an inductor such as inductor 206 in the present invention's transformer 200 than for an inductor such as primary winding 104 and secondary winding 106 in the exemplary transformer in FIGS. 1A and 1B. As known in the art, an on-chip inductor's capacitance is inversely proportional to distance "d." Therefore, the capacitance of inductor 206 of the invention's transformer 200 is much lower than the capacitance of primary winding 104 and secondary winding 106 in the exemplary transformer in FIGS. 1A and 1B.

Additionally, the capacitance of inductor 206 can be made low enough to allow the width of inductor 206 to be increased. Increasing the width of an inductor such as inductor 206 has the effect of reducing the resistance of inductor 206. The reduction in the resistance of inductor 206 results in an increase of the quality factor of inductor 206.

Figure 1A:
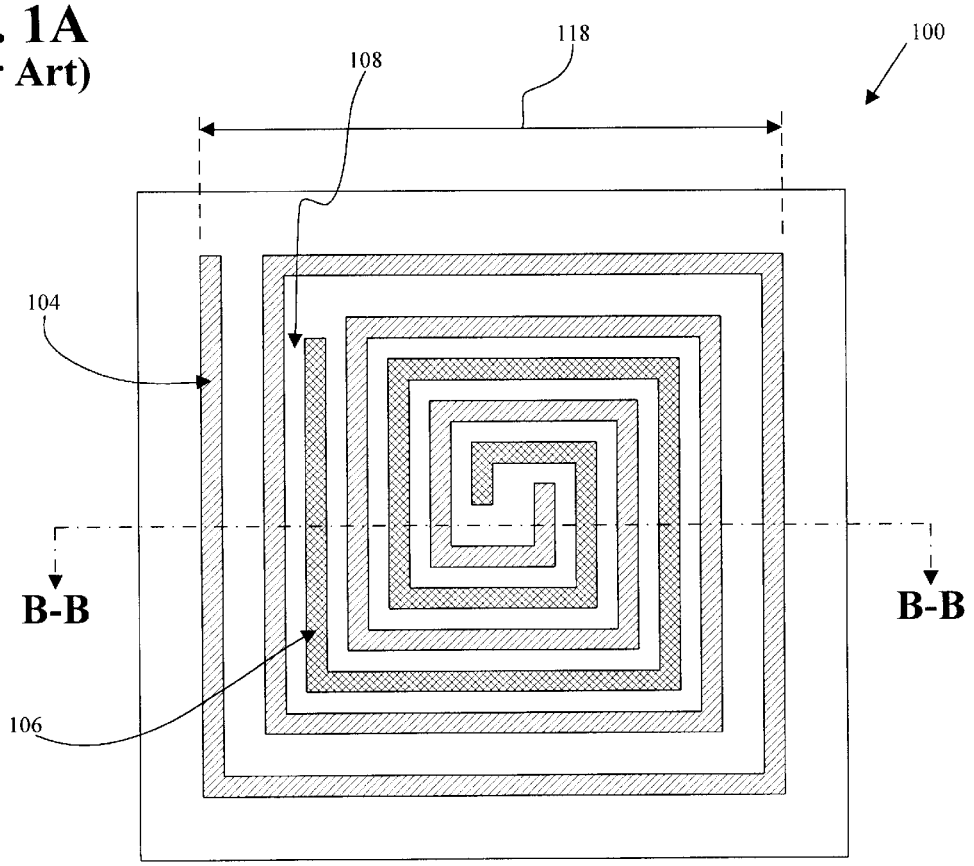
FIG. 1A illustrates a top view of an exemplary transformer on an area of a semiconductor die.
Figure 1B:
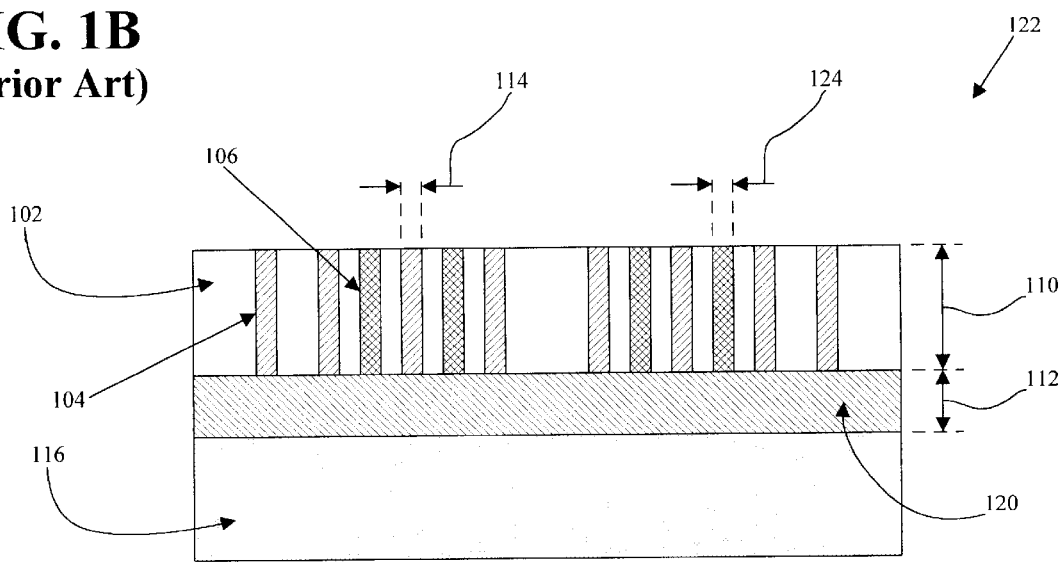
FIG. 1B illustrates a cross-sectional view of the exemplary transformer of FIG. 1A.

Another effect of increasing the width of inductor 206 is increasing the size of the exemplary embodiment of the invention's transformer 200. However, the size of the invention's transformer 200 does not suffer from the same size constraints that limit the size of an on-chip transformer formed in a metal level of a semiconductor. For example, the exemplary transformer in FIGS. 1A and 1B is constrained in size because it has to compete for space on metal level 102 with other components of the semiconductor die that are also patterned into metal level 102. However, since the exemplary embodiment of the invention's transformer 200 is formed on the top surface of the semiconductor die, the invention's transformer 200 does not compete for space on the semiconductor die with other components. Therefore, the exemplary embodiment of the invention's transformer 200 can cover as much of the area on the top surface of the semiconductor die as required in a specific application.

Also known in the art, the resistance of an inductor is inversely related to the cross-sectional area of the inductor. The cross-sectional area of the inductor is equal to the width of the inductor times its depth or thickness. Therefore, increasing the width of the inductor can decrease the inductor's resistance. Also, increasing the thickness of the inductor will further decrease the inductor's resistance.

As shown above, the capacitance of an on-chip inductor is proportional to the width of the inductor. Therefore, increasing the width of an inductor increases the inductor's capacitance. However, the adverse effect of an increase in the inductor's width is countered by the fact that, according to the present invention, distance "d" is a relatively great distance. For example, distance "d" for secondary winding 106 of the exemplary transformer in FIGS. 1A and 1B can be increased to only approximately 6000 Angstroms. However, distance "d" for inductor 206 of the invention's transformer 200 can be made much greater, for example approximately 15.0 microns, to allow width 124 of inductor 206 to increase while keeping the capacitance of inductor 206 still relatively low.

Additionally, since inductors 204 and 206 are fabricated on top of semiconductor die 220, inductors 204 and 206 can be thicker than typical metal conductors fabricated inside semiconductor die 220. Accordingly, thickness 232 of inductor 204 and thickness 236 of inductor 206 of an exemplary embodiment of the invention's transformer 200 can be approximately 3.0 to 5.0 microns. However, as known by a person of ordinary skill in the art, the thickness of an on-chip inductor is typically only 1.5 to 3.0 microns. For example, thickness 110 of primary winding 104 and secondary winding 106 of the exemplary transformer in FIG. 1B is typically only 1.5 to 3.0 microns. As is known in the art, the resistance of an inductor is inversely proportional to its thickness. Therefore, inductors, such as inductor 204 and inductor 206, of the present invention's transformer 200 have a lower resistance for the same length and width than inductors such as primary winding 104 and secondary winding 106 of the exemplary transformer in FIGS. 1A and 1B.

As stated above, the quality factor "Q" of an inductor is inversely proportional to the resistance of the inductor. As shown above, the resistance of inductor 204 and inductor 206 of the present invention's transformer 200 are much lower than the resistance of primary winding 104 and secondary winding 106 of the exemplary transformer in FIGS. 1A and 1B. Therefore, the quality factors of inductor 204 and inductor 206 of the invention's transformer 200 are much greater than the corresponding quality factors of primary winding 104 and secondary winding 106 of the exemplary transformer. The quality factor of an inductor patterned in a metal level of a semiconductor die, such as primary winding 104 and secondary winding 106 of the exemplary transformer in FIGS. 1A and 1B, is generally limited to values below 10.0. However, the quality factor of inductor 204 and inductor 206 of the exemplary embodiment of the invention's transformer 200 can range from 15.0 to 40.0.

Moreover, as stated above, the self-resonance frequency of an inductor is inversely related to the capacitance of the inductor. As explained above, the capacitance of inductor 206 of the exemplary embodiment of the invention's transformer 200 is much smaller than the capacitance of secondary winding 106 of the exemplary transformer in FIGS. 1A and 1 B. Therefore, the corresponding self-resonance frequency of inductor 206 of the present invention's transformer 200 is much higher than the self-resonance frequency of secondary winding 106 of the exemplary transformer in FIGS. 1A and 1B. The high self-resonance frequency of inductor 204 and inductor 206 of the exemplary embodiment of the present invention's transformer 200 is very important in the design of transformers for use in high frequency applications such as RF applications using frequencies from 800 to 2400 MHz.

As discuss above, a maximum coefficient of coupling of only about 60% is possible for on-chip transformers with both the primary and secondary windings patterned in the same metal level of the chip. The reason is that a significant portion of the magnetic field generated by each of the windings does not intersect the area occupied by the opposite winding. In comparison, the coupling coefficient between inductor 204 and inductor 206 of the exemplary embodiment of the present invention's transformer 200 can exceed 90%. This high coupling coefficient between inductor 204 and inductor 206 is possible because the present invention's transformer 200 is designed with inductor 206 directly above inductor 204. In addition, the width of inductors 204 and 206 are typically so great that a high percentage of the magnetic field generated by each inductor is captured by the opposing inductor.

The exemplary embodiment of the present invention's transformer 200 also has numerous advantages over discrete off-chip transformers. Since the invention's transformer 200 is fabricated on the semiconductor die and encapsulated along with semiconductor die 220, it has a small size relative to a discrete off-chip transformer.

Another advantage of the present invention's transformer 200 over discrete off-chip transformers is long-term reliability. Since the electrical connections in the invention's transformer are made directly to the die bond pads and further since the semiconductor die and the invention's transformer are encapsulated and protected by a common mold compound, the interconnects of the invention's transformer 200 are not subject to long-term damage from vibration, corrosion, chemical contamination, oxidation, and other chemical and physical forces, because they are not exposed to those elements, but are encapsulated inside a common mold compound.

The fabrication of the present invention's transformer 200 is also cost-effective, since the fabrication can easily fit into processes well known in the art, such as the bumping technology and flip-chip technology. The invention's transformer does not require independent fabrication or assembly, as required by off-chip transformers.

Thus the exemplary embodiment of the present invention's transformer 200 satisfies the need in the art for a transformer that is fabricated on a semiconductor die, with very low unwanted capacitance, resulting in a high quality factor, high self-resonance frequency, and high coupling coefficient of the transformer's cross-coupled inductors.

Another embodiment of the present invention's transformer uses the last metal level on the semiconductor die (not shown in any of the FIGS. in the present application) and inductor 204 in FIG. 2B to construct the invention's transformer. In that embodiment, one of the cross-coupled inductors is patterned into the last metal level of the semiconductor die. The other cross-coupled inductor is fabricated on the passivation layer that protects the last metal level of the semiconductor die. The invention's transformer in this embodiment achieves a high coupling coefficient between its cross-coupled inductors, since one of the cross-coupled inductors is placed directly above the other, as in the exemplary embodiment of the invention's transformer 200 in FIG. 2B.

While a certain embodiment is illustrated in the drawings and is described in the present application, it is apparent to those of ordinary skill in the art that the specific embodiment described herein may be modified without departing from the inventive concepts described. For example, different combinations of dielectrics, metals, and different sizes, dimensions, and layout may be used to meet certain design requirements without departing from the scope of the present invention as defined by the claims of the present application.

Thus, an improved transformer comprising stacked inductors has been described.

What is claimed is:

1. A structure comprising:
   a first inductor fabricated over a first bond pad, said first inductor being electrically connected to said first bond pad;
   a dielectric deposited over said first inductor;
   a second inductor fabricated over said dielectric, said second inductor being cross-coupled with said first inductor;
   said first inductor, said dielectric, and said second inductor being encapsulated in a package.

2. The structure of claim 1 wherein said first inductor has a first and a second terminal, said first terminal of said first inductor being electrically connected to said first bond pad, and said second terminal of said first inductor being electrically connected to a second bond pad.

3. The structure of claim 2 wherein said second inductor has a first and a second terminal, said first terminal of said second inductor being electrically connected to a third bond pad, and said second terminal of said second inductor being electrically connected to a fourth bond pad.

4. The structure of claim 1 wherein said first inductor is selected from the group consisting of copper, copper-aluminum alloy, and gold.

5. The structure of claim 1 wherein said second inductor is selected from the group consisting of copper, copper-aluminum alloy, and gold.

6. The structure of claim 1 wherein a passivation layer is situated between said first inductor and said dielectric.

7. The structure of claim 1 wherein said dielectric comprises a low-k dielectric.

8. The structure of claim 1 wherein said dielectric is selected from the group consisting of BCB and low-k polyimide.

9. The structure of claim 6 wherein said passivation layer is selected from the group consisting of silicon dioxide and silicon nitride.

10. The structure of claim 1 wherein said bond pad is selected from the group consisting of copper, aluminum, copper-aluminum alloy, and gold.

11. A structure comprising:
    a first inductor fabricated over a first bond pad, said first inductor comprising a first metal, said first bond pad comprising a second metal, said first inductor being electrically connected to said first bond pad;
    a dielectric deposited over said first inductor;
    a second inductor fabricated over said dielectric, said second inductor comprising a third metal; said second inductor being electrically connected to a second bond pad, said second bond pad comprising said second metal, said second inductor being cross-coupled with said first inductor.

12. The structure of claim 11 wherein said first inductor has a first and a second terminal, said first terminal of said first inductor being electrically connected to said first bond pad, and said second terminal of said first inductor being electrically connected to a third bond pad.

13. The structure of claim 12 wherein said second inductor has a first and a second terminal, said first terminal of said second inductor being electrically connected to said second bond pad, and said second terminal of said second inductor being electrically connected to a fourth bond pad.

14. The structure of claim 11 wherein said first metal is selected from the group consisting of copper copper-aluminum alloy, and gold.

15. The structure of claim 11 wherein said second metal is selected from the group consisting of copper, aluminum, copper-aluminum alloy, and gold.

16. The structure of claim 11 wherein said third metal is selected from the group consisting of copper, copper-aluminum alloy, and gold.

17. The structure of claim 11 wherein a passivation layer is situated between said first inductor and said dielectric.

18. The structure of claim 11 wherein said dielectric comprises a low-k dielectric.

19. The structure of claim 11 wherein said dielectric is selected from the group consisting of BCB and low-k polyimide.

20. The structure of claim 17 wherein said passivation layer is selected from the group consisting of silicon dioxide and silicon nitride.

* * * * *